United States Patent
Pulluru et al.

(10) Patent No.: US 10,283,177 B1
(45) Date of Patent: May 7, 2019

(54) METHOD AND SYSTEM FOR CONTROLLER HOLD-MARGIN OF SEMICONDUCTOR MEMORY DEVICE

(71) Applicant: SAMSUNG ELECTRONICS CO., LTD., Suwon-si, Gyeonggi-Do (KR)

(72) Inventors: Lava Kumar Pulluru, Bangalore (IN); Ankur Gupta, Bangalore (IN)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 16/116,615

(22) Filed: Aug. 29, 2018

(30) Foreign Application Priority Data

Mar. 28, 2018 (IN) .............................. 201841011733

(51) Int. Cl.
*H03H 11/26* (2006.01)
*G11C 7/00* (2006.01)
*G11C 7/22* (2006.01)
*H03K 5/15* (2006.01)
*G11C 7/10* (2006.01)
*H03K 5/00* (2006.01)

(52) U.S. Cl.
CPC .............. *G11C 7/222* (2013.01); *G11C 7/106* (2013.01); *H03K 5/1508* (2013.01); *H03K 2005/00058* (2013.01)

(58) Field of Classification Search
CPC ...... G11C 7/222; G11C 7/106; H03K 5/1508; H03K 2005/00058
See application file for complete search history.

(56) References Cited

U.S. PATENT DOCUMENTS

| | | | |
|---|---|---|---|
| 6,081,142 A * | 6/2000 | Douchi | G11C 7/1051 327/158 |
| 6,650,575 B1 | 11/2003 | Khanna | |
| 7,132,872 B2 * | 11/2006 | Kang | H03K 5/131 327/276 |
| 7,394,302 B2 * | 7/2008 | Shimazawa | H03K 5/133 327/261 |
| 8,191,028 B1 * | 5/2012 | Bourgeault | G06F 17/5077 716/108 |

\* cited by examiner

*Primary Examiner* — Kenneth B Wells
(74) *Attorney, Agent, or Firm* — Volentine, Whitt & Francos, PLLC

(57) ABSTRACT

A system for controlling a hold-margin in a semiconductor memory device includes a programmable RC network communicatively coupled to a delay logic circuit, a latch clock generator and a latch circuit. A delay associated with a clock path is induced using a combination of a logic circuit and a wire placed across at least one of a column and a row of the semiconductor memory device. A delay associated with the data path is induced using a combination of the delay logic circuit and at least one of the load cell and a wire routed across at least one of a column and a row of the semiconductor memory device. The system controls the hold-margin based on the delay associated with the data path and the delay associated with the clock path.

13 Claims, 6 Drawing Sheets

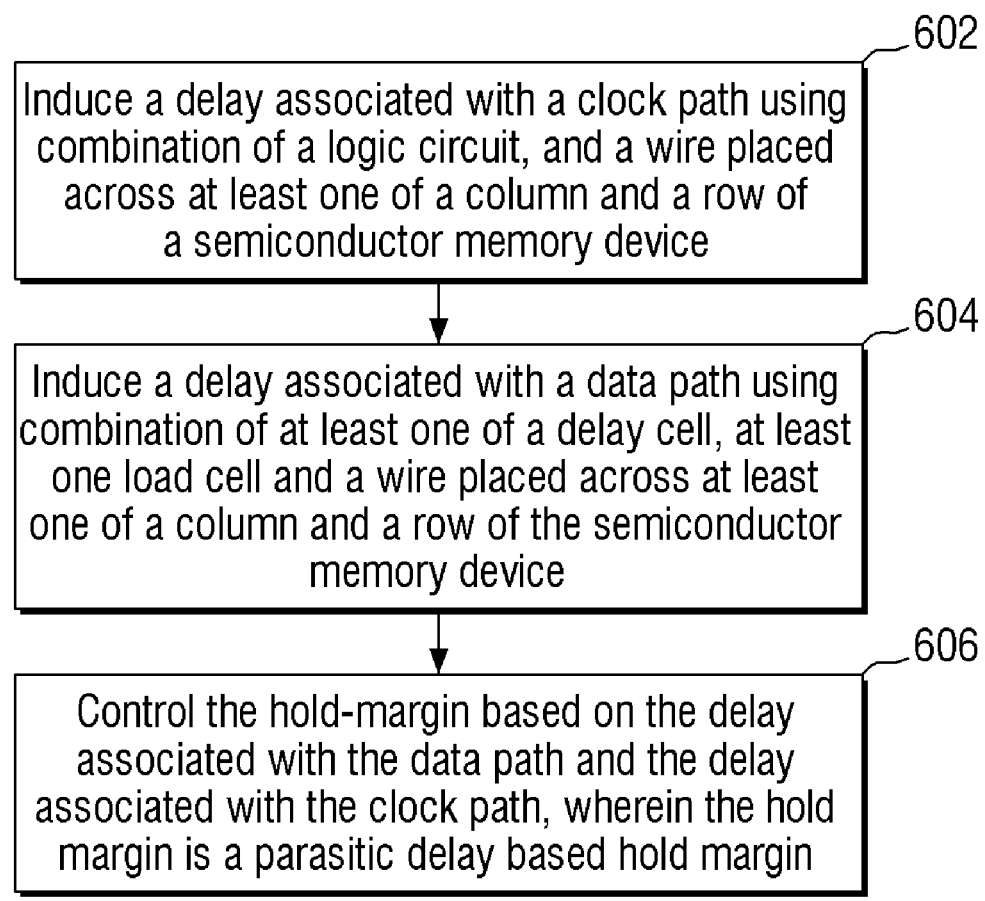

US 10,283,177 B1

METHOD AND SYSTEM FOR CONTROLLER HOLD-MARGIN OF SEMICONDUCTOR MEMORY DEVICE

CROSS-REFERENCE TO RELATED APPLICATIONS

This application claims priority under 35 U.S.C. § 119 to Indian Patent Application No. 201841011733 filed on Mar. 28, 2018, in the Indian Intellectual Property Office, the disclosure of which is incorporated by reference herein in its entirety.

TECHNICAL FIELD

The present application relates to a semiconductor memory device, and more particularly to a method and system for controlling a hold-margin of a semiconductor memory device.

BACKGROUND

A System On Chip (SOC) includes a semiconductor memory device (e.g., on-chip memory or the like). Usually 10% to 40% of an area of the SOC is occupied by the on-chip memory. The on-chip memory can be a Static Random-Access Memory (SRAM), a Read-Only Memory (ROM), and a register file. The on-chip memory contains two types of hardware circuits (e.g., bitcell array circuit and periphery circuit). The bitcell array circuit includes an array of bitcells. Each bitcell stores 1-bit of data. The periphery circuit includes logic gates to control a read operation and a write operation.

A hold margin of the on-chip-memory indicates a delay between an internal clock signal and a data signal (e.g., address signal, enable signal, or the like). The hold margin corresponds to a data path delay (D2) greater than an internal clock path delay (D1) as shown in FIG. 1. Conventionally the data signal is delayed to meet a hold margin. FIG. 1 shows implementation of the delay using logic gates in the data path. A circuit 100 includes a clock generator 102, a set of delay logics 104a-104c, a logic 106, a latch clock generator 108, a latch 110, a decoder 112, a set of input/output (IO) circuits 114a-114c. The latch clock generator 108 is connected to the latch 110, where the latch 110 is connected to the decoder 112. The clock generator 102, the set of delay logics 104a-104c, the logic 106, and the latch clock generator 108 are included in a control block 150.

Since the logic gate delay varies across Process, Voltage and Temperature (PVT) corners, the number of delay logics 104a-104c required are very high to satisfy the hold margin across the PVT range. This results in limiting performance of a compiler associated with the SOC. Further, the number of delay logics 104a-104c placed is based on the biggest instance, so small instances will unnecessarily contain an extra delay, which hampers performance of the semiconductor memory device.

Further, the required amount of delay to meet the hold margin is different for different sizes of the semiconductor memory device. Further, the same number of delay logics 104a-104c is placed inside the control block 150, regardless of the different sizes of the semiconductor memory device. Thus, the number of delay cells cannot be changed based on the size of the semiconductor memory device and the delay required for biggest instance (i.e., large numbers of usage of the 10 circuit) is used in smaller instances (i.e., less numbers of usage of the 10 circuit) as well. This hampers performance of the smaller instances.

SUMMARY

Embodiments herein disclose a method for controlling a hold-margin of a semiconductor memory device. The method includes inducing a delay associated with a clock path using a combination of a logic circuit and a wire placed across at least one of a column and a row of the semiconductor memory device. Further, the method includes inducing a delay associated with a data path using a combination of at least one delay logic circuit and at least one load cell and a wire placed across at least one of a column and a row of the semiconductor memory device. Further, the method includes controlling the hold-margin based on the delay associated with the data path and the delay associated with the clock path.

Embodiments herein disclose a system for controlling a hold-margin in a semiconductor memory device. The system includes at least one delay logic circuit, a latch clock generator, a clock generator, and a programmable resistor-capacitor (RC) network. The clock generator generates a clock signal and a data path. The programmable RC network is communicatively coupled to the at least one delay logic circuit, the latch clock generator and a latch circuit. A delay associated with the clock path is induced using a combination of a logic circuit and a wire placed across at least one of a column and a row of the semiconductor memory device. A delay associated with the data path is induced using a combination of the at least one of a delay cell and at least one of load cell and a wire placed across at least one of a column and a row of the semiconductor memory device. The system is configured to control the hold-margin based on the the delay associated with the data path and the delay associated with the clock path.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF FIGURES

This disclosure is illustrated in the accompanying drawings, throughout which like reference letters indicate corresponding parts in the various figures. The embodiments herein will be better understood from the following description with reference to the drawings, in which:

FIG. 6 is a flow diagram illustrating a method for controlling a hold-margin of a semiconductor memory device, according to an embodiment as disclosed herein.

DETAILED DESCRIPTION

Figure 1:
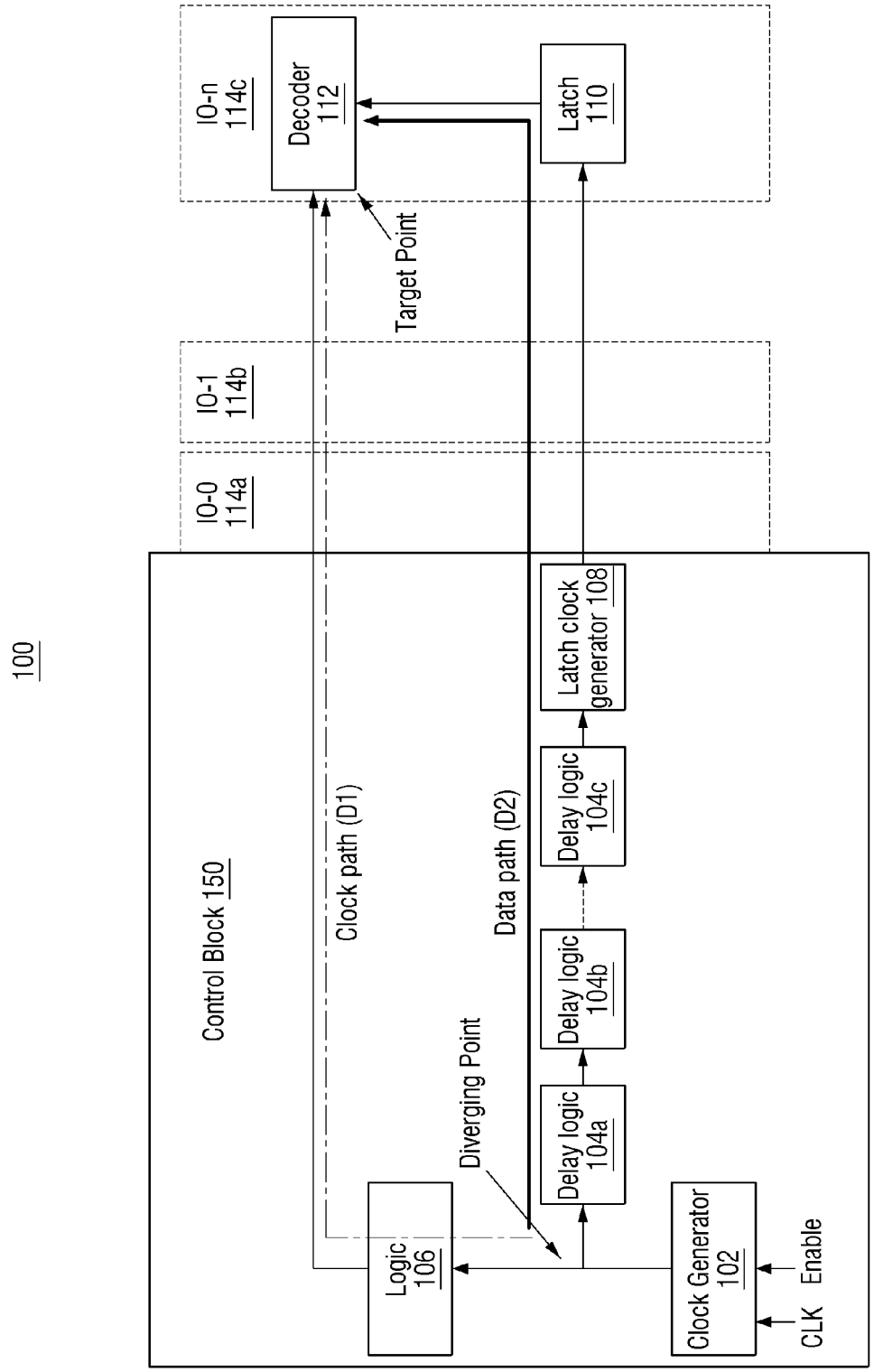
FIG. 1 is a circuit diagram illustrating an implementation of a delay using logic gates, according to related art.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The examples used herein are intended merely to facilitate an understanding of ways in which the embodiments herein can be practiced and to further enable those skilled in the art to practice the embodiments herein. Accordingly, the examples should not be construed as limiting the scope of the embodiments herein.

As is traditional in the field, embodiments may be described and illustrated in terms of blocks which carry out a described function or functions. These blocks, which may be referred to herein as units or modules or the like, are physically implemented by analog or digital circuits such as logic gates, integrated circuits, microprocessors, microcontrollers, memory circuits, passive electronic components, active electronic components, optical components, hardwired circuits, or the like, and may optionally be driven by firmware and software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The terms first level and second level, high and low and 1 and 0, as used in the following description may be used to describe various logic states as known in the art. Particular voltage values of the second and first levels are defined arbitrarily with regard to individual circuits. Furthermore, the voltage values of the second and first levels may be defined differently for individual signals such as a clock and a digital data signal. Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" or low and high in certain locations, one skilled in the art appreciates that the logical values can be switched, with the remainder of the circuit adjusted accordingly, without affecting operation of the present disclosure.

Embodiments herein provide a system for controlling a hold-margin in a semiconductor memory device. The system includes at least one delay logic circuit, a latch clock generator, a clock generator, and a programmable resistor-capacitor (RC) network. The clock generator generates a clock signal and a data path. The programmable RC network is communicatively coupled to the at least one delay logic circuit, the latch clock generator and the latch circuit. A delay associated with a clock path is induced using combination of a logic circuit and a wire placed across at least one of a column and a row of the semiconductor memory device. A delay associated with the data path is induced using a combination of the at least one delay logic circuit, at least one of a load cell and a wire placed across at least one of a column and a row of the semiconductor memory device. The system is configured to control the hold-margin based on the the delay associated with the data path and the delay associated with the clock path.

In an embodiment, the delay associated with the clock path is induced using a combination of the logic circuit and the wire placed across the column of the semiconductor memory device. The delay associated with the data path is induced using a combination of at least one of the delay logic circuits and at least one of the load cell and the wire placed across the column of the semiconductor memory device. The system is configured to control the hold-margin based on the delay associated with the data path and the delay associated with the clock path.

In an embodiment, the delay associated with the clock path is induced using a combination of the logic circuit and the wire placed across the column of the semiconductor memory device. The delay associated with the data path is induced using a combination of at least one of the delay logic circuits and at least one of the load cell and the wire placed across a plurality of columns of the semiconductor memory device. The system is configured to control the hold-margin based on the delay associated with the data path and the delay associated with the clock path.

In an embodiment, the delay associated with the clock path is induced using a combination of the logic circuit and the wire placed across the row of the semiconductor memory device. The delay associated with the data path is induced using a combination of at least one of the delay logic circuit and at least one of the load cell and the wire placed across the row of the semiconductor memory device. The system is configured to control the hold-margin based on the delay associated with the data path and the delay associated with the clock path.

In an embodiment, the delay associated with the clock path is induced using a combination of the logic circuit and the wire placed across the row of the semiconductor memory device. The delay associated with the data path is induced using a combination of at least one of the delay logic circuit and at least one of the load cell and the wire placed across the plurality of rows of the semiconductor memory device. The system is configured to control the hold-margin based on the delay associated with the data path and the delay associated with the clock path.

In an embodiment, the delay associated with the clock path is induced using a combination of the logic circuit and the wire placed across a combination of the row and the column of the semiconductor memory device. The delay associated with the data path is induced using a combination of at least one of the delay logic circuit and at least one of the load cell and the wire placed across the combination of the row and the column of the semiconductor memory device. The system is configured to control the hold-margin based on the delay associated with the data path and the delay associated with the clock path.

In an embodiment, the delay associated with the clock path is induced using a combination of the logic circuit and the wire placed across a combination of the row and the column of the semiconductor memory device. The delay associated with the data path is induced using a combination of at least one of the delay logic circuit and at least one of the load cell and the wire placed across the combination of the plurality of rows and the plurality of columns of the semiconductor memory device. The system is configured to control the hold-margin based on the delay associated with the data path and the delay associated with the clock path.

In an embodiment, the system is configured to determine a required amount of the delay associated with the data path to control the hold margin when the number of columns are minimum.

In an embodiment, the system is configured to determine a required amount of the delay associated in the data path to control the hold margin when the number of columns are maximum.

In an embodiment, the system is configured to control the hold-margin of the semiconductor memory device using the programmable RC network based on at least a difference between the required amount of the delay associated with the data path when the number of columns are maximum and the required amount of the delay associated with the data path when the number of columns are minimum.

In an embodiment, the system is configured to determine the required amount of the delay associated with the data path to control the hold margin when the number of rows are minimum.

In an embodiment, the system is configured to determine a required amount of the delay in the data path to control the hold margin when the number of rows are maximum.

In an embodiment, the system is configured to control the hold-margin of the semiconductor memory device using the programmable RC network based on at least a difference between the required amount of the delay associated with the data path when the number of rows are maximum and the required amount of the delay associated with the data path when the number of rows are minimum.

In an embodiment, the hold margin is a parasitic delay based hold margin.

In an embodiment, the hold margin can be referred to as an internal hold margin of the SRAM.

In an embodiment, the hold-margin corresponds to a difference between the delay associated with the data path and the delay associated with the clock path.

In an embodiment, the delay associated with the data path is based on operation of the least one delay logic circuit along with a programmable RC network.

In an embodiment, the system is configured to manage the at least one hold-margin across a PVT corner.

Unlike related-art circuits, the disclosed system and method can be used to control the parasitic delay based hold-margin in a high-speed memory (e.g., SRAM, a ROM, or the like). The disclosed system and method can be used to improve the performance of the high-speed memory. In an example, for a compiler (e.g., 28 nm RA1HC compiler, SS28LPP_RA1HC compiler, or the like), 2% to 6% of performance gain has been achieved, based on the size of the memory.

The disclosed system and method can be used to reduce the logic gate in a control block of the semiconductor memory device because a lesser delay cell requirement exists in the semiconductor memory device. This results in an area gain, in some cases where the area of a macro is limited by the control block. In related-art circuits, a physical area occupied by the semiconductor memory device is greater due to the control block requiring more area for a greater amount of the delay logic cells. Such greater area results in increasing the cost of a circuit design. But, the disclosed method can be used to reduce the system design cost as the hold-margin is controlled based on the delay associated with the data path and the delay associated with the clock path and the delay associated with the data path is implemented using the wire placed across the column and the row of the semiconductor memory device. In advanced technology semiconductor memory device, a logic gate variation is higher compared to an RC delay variation, so that the method will be more effective with technology scaling. In the disclosed circuits, the wire is placed across the column and the row of the semiconductor memory device, so as to reduce the delay cell variation in the semiconductor memory device.

The disclosed method can be implemented in the compiler (e.g., 28 nm SS28RA1HC memory compiler, 10 nm RF2HS memory compiler, or the like), an SRAM compiler, a wireless communication device, a TV, an embedded system, an application processor, or any other digital SoC or Integrated Circuit (IC).

Referring now to the drawings and more particularly to FIGS. 2 through 6, where similar reference characters denote corresponding features consistently throughout the figures, there are shown preferred embodiments.

Figure 2:
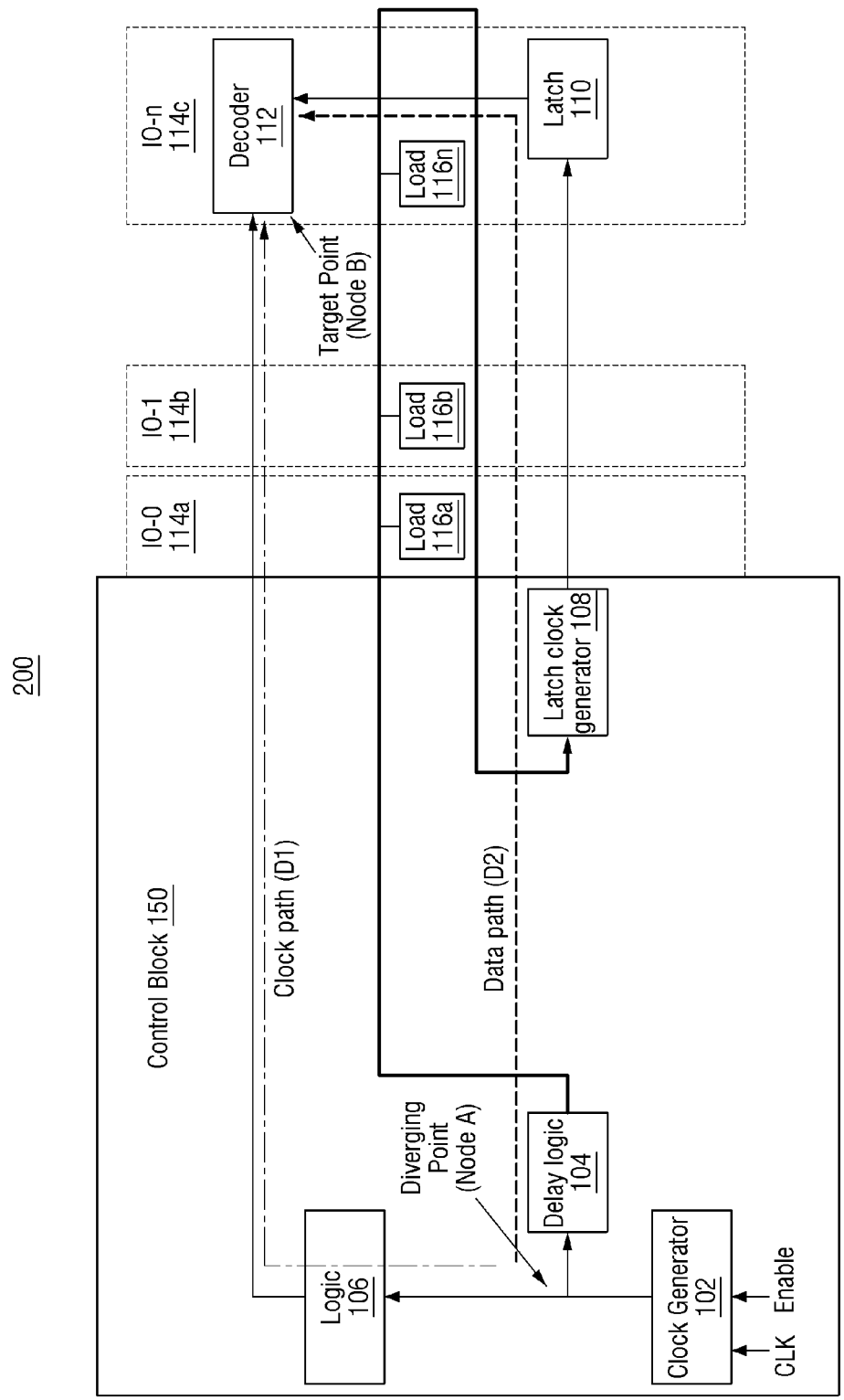
FIG. 2 is a circuit diagram illustrating an RC-network delay across columns for a latch clock generation, according to an embodiment as disclosed herein.

FIG. 2 is a circuit diagram 200 illustrating an RC-network delay across columns for a latch clock generation, according to an embodiment as disclosed herein.

In general, a semiconductor memory device (e.g., SRAM, ROM, register files, or the like) includes a memory cell array (not shown) having a plurality of memory cells (not shown) arranged in a matrix of rows and columns. A plurality of word lines (not shown) is arranged to correspond to the respective rows of the memory cells. A plurality of bit lines (not shown) is arranged to correspond to the respective columns of the memory cells. The wire contains parasitic resistance (not shown), and the load cell connected to the wire is nothing but capacitance.

Specifically, the memory cells are placed individually at the respective points of intersection between the word line and the bit line pairs. The memory cells thus arranged as the matrix compose the memory cell array for storing information.

Referring to the FIG. 2, the circuit diagram 200 includes a control block 150, a latch 110, a decoder 112, input/output circuits (IO-0 114a-114c), and a set of loads 116a-116n, where the control block 150 includes a clock generator 102, a delay logic 104, a logic circuit 106 and a latch clock generator 108. A clock input and an enable input (e.g., data input, address input or the like) are provided to the clock generator 102. The clock generator 102 provides a Node A, where the Node A is a diverging point for a clock path (D1) and a data path (D2). The clock path (D1) comprises the logic circuit 106 and a wire routed across columns of the semiconductor memory device. The latch clock generator 108 is coupled with the latch 110, where the latch 110 is coupled with the decoder 112.

A delay associated with the clock path (D1) is induced using combination of the logic circuit 106 and the wire routed across the columns of the semiconductor memory device. A data path (D2) is implemented using a combination of delay logic 104, loads 116a-116n, and a wire placed across the columns of the semiconductor memory device to fix the hold margin. The delay associated with the data path (D2) is induced using a combination of the delay logic 104, at least one of the loads 116a-116n and the wire placed across the columns of the semiconductor memory device. The clock path (D1) and the data path (D2) converge at a Node B, such that a data path delay (TD2) is more than a clock path delay (TD1).

Further, the size of the programmable RC network is a function of a memory size (IO-0 to IO-n 114a-114c), "n" increases/decreases as a size of the memory increases/decreases, so that the delay provided by the RC-network scales along with "n". The RC network delay variation is less compared to the delay cell variation across PVT corners. This results in achieving higher performance of the semiconductor memory device.

Further, a latch clock can be identified based on the latch 110. By traversing the latch clock, the latch clock generator 108 can be identified, and an input to the latch clock generator 108 can be detected if the input is routed across rows/columns.

Figure 3:
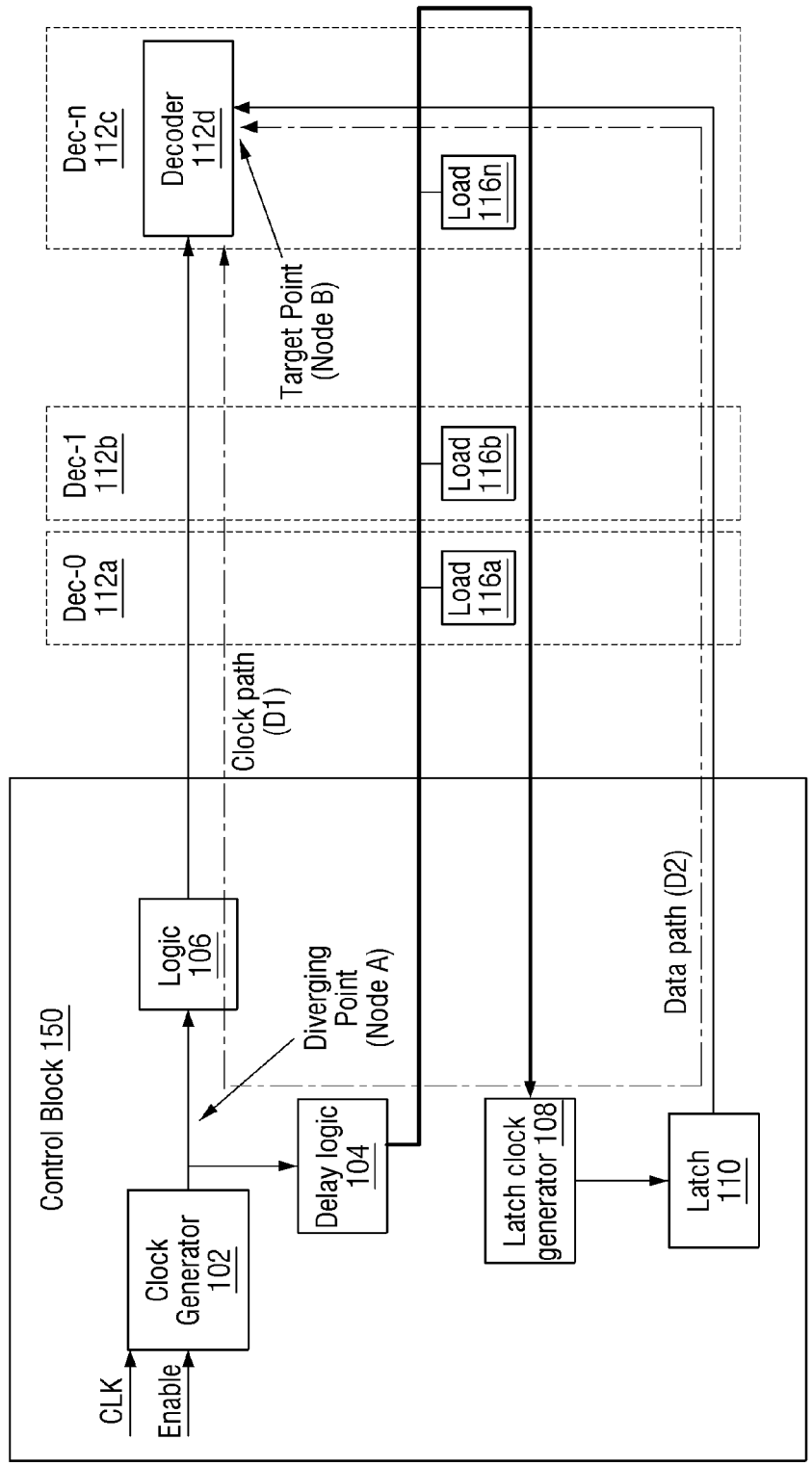
FIG. 3 is a circuit diagram illustrating the RC-network delay across rows for latch clock generation, according to an embodiment as disclosed herein.

FIG. 3 is a circuit diagram 300 illustrating the RC-network delay across rows for the latch clock generation, according to an embodiment as disclosed herein. The semiconductor memory device including the memory cell array (not shown) having the plurality of memory cells (not shown) arranged in the matrix of rows and columns. The plurality of word lines (not shown) is arranged to correspond to the respective rows of the memory cells. The plurality of bit lines (not shown) is arranged to correspond to the respective columns of the memory cells. The wire contains parasitic resistance (not shown), and the load cell connected to the wire is nothing but capacitance.

The circuit diagram 300 includes the control block 150, the latch 110, the decoders 112a-112d, and the set of loads 116a-116n, where the control block 150 includes the clock generator 102, the delay logic 104, the logic circuit 106 and the latch clock generator 108. The clock input and the enable input are provided to the clock generator 102. The latch clock generator 108 is connected with the latch 110. The latch 110 is connected with the decoder 112d.

The clock generator 102 provides the Node A, where the Node A is the diverging point for the clock path (D1) and the data path (D2). The clock path (D1) comprises the logic circuits 106 and wire placed across rows of the semiconductor memory device. The delay associated with the clock path (D1) is induced using a combination of the logic circuit 106 and the wire routed across the rows of the semiconductor memory device.

The data path (D2) is implemented using a combination of the delay logic 104, the loads 116a-116n and the wire placed across rows of the semiconductor memory device to fix the hold margin. The delay associated with the data path (D2) is induced using a combination of the delay cell 104, at least one of loads 116a-116n and the wire placed across the rows of the semiconductor memory device. The clock path (D1) and the data path (D2) converge at Node B, such that the data path delay (TD2) is more than clock path delay (TD1) (i.e., hold margin=TD2−TD1>0).

Figure 4:
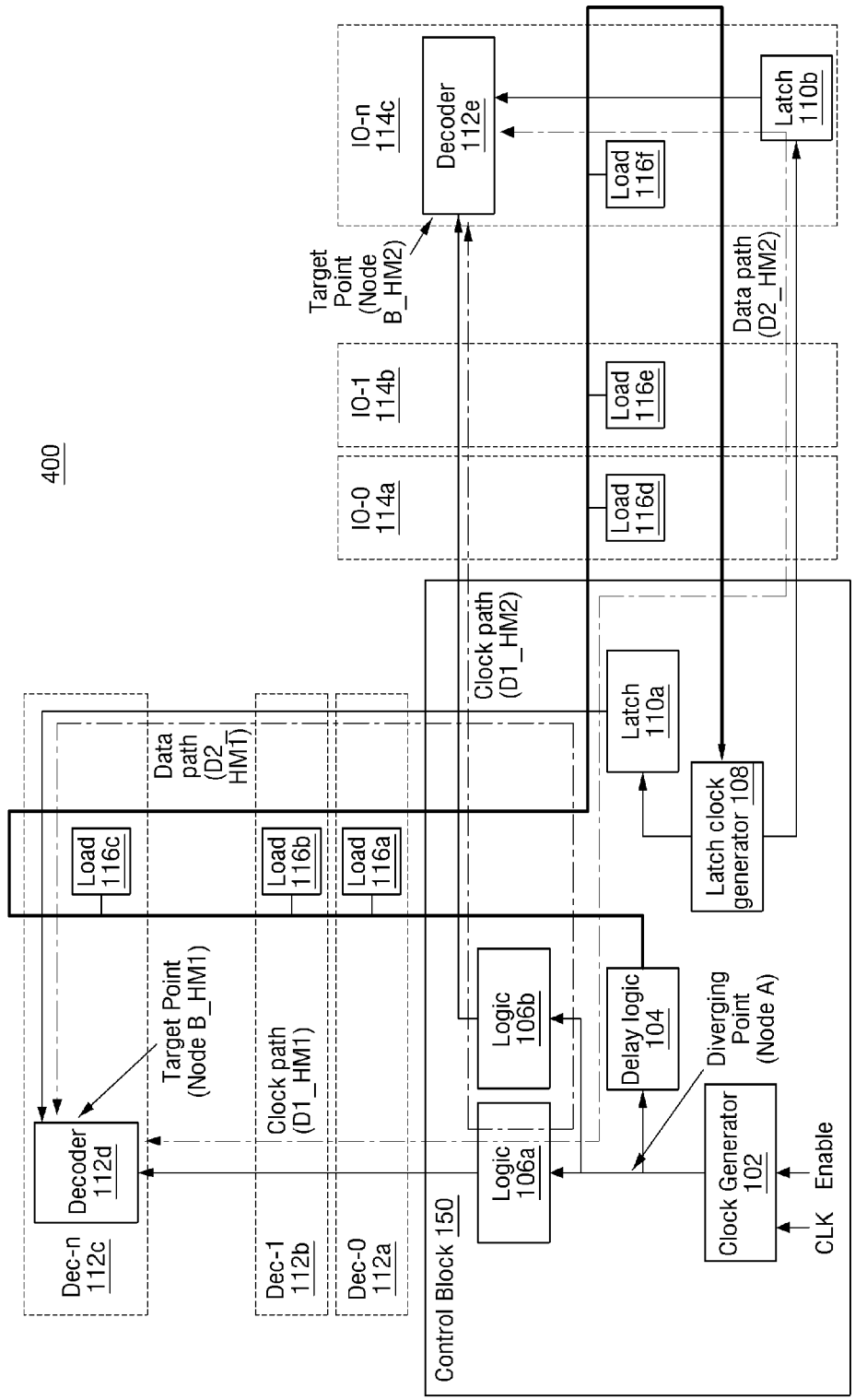
FIG. 4 is a circuit diagram illustrating the RC-network delay across rows and columns for latch clock generation, according to an embodiment as disclosed herein.

FIG. 4 is a circuit diagram 400 illustrating an RC-network delay across rows and columns for latch clock generation, according to an embodiment as disclosed herein.

Referring to the FIG. 4, the semiconductor memory device including the memory cell array (not shown) having the plurality of memory cells (not shown) arranged in the matrix of rows and columns. The plurality of word lines (not shown) is arranged to correspond to the respective rows of the memory cells. The plurality of bit lines (not shown) is arranged to correspond to the respective columns of the memory cells. The wire contains parasitic resistance (not shown), and the load cell connected to the wire is nothing but capacitance.

The circuit diagram 400 includes the control block 150, the latches 110a and 110b, the decoder 112a-112e, the 10 circuits 114a-114c, and a set of loads 116a-116c, where the control block 150 includes the clock generator 102, the delay logic 104, the logics 106a and 106b, and the latch clock generator 108. The clock input and the enable input are provided to the clock generator 102. The latch clock generator 108 is connected with the latch 110a and 110b. The latch 110a is connected with the decoder 112c. The latch 110b is connected to the decoder 112d.

The clock generator 102 provides the Node A, where the Node A is the diverging point for the clock path (D1) and the data path (D2).

In the circuit diagram 400, two hold margins (e.g., HM1 and HM2) exist, where the HM1=D2_HM1−D1_HM1, and the HM2=D2_HM2−D1_HM2. The diverging point for both HM1 and HM2 is the same (i.e., NODE A).

The delay associated with the clock path (D1) is induced using a combination of the logic circuits 106a and 106b and the wire placed across the columns and rows of the semiconductor memory device.

The delay associated with the data path (D1) is induced using a combination of the delay cell 104, at least one of loads 116a-116f, and the wire placed across the columns and the rows of the semiconductor memory device.

Further, the converging point (i.e., target point) for HM1 is NODE B_HM1 and for HM2 is Node B_HM2. The data path (D2_HM1 and D2_HM2) is implemented using a combination of the delay logic 104, loads 116a-116f, and the wire placed across rows and columns of the semiconductor memory device to fix the hold margin FIG. 5 is a circuit diagram 500 illustrating the RC-network delay across rows and columns for a different latch clock generation, according to an embodiment as disclosed herein.

Figure 5:
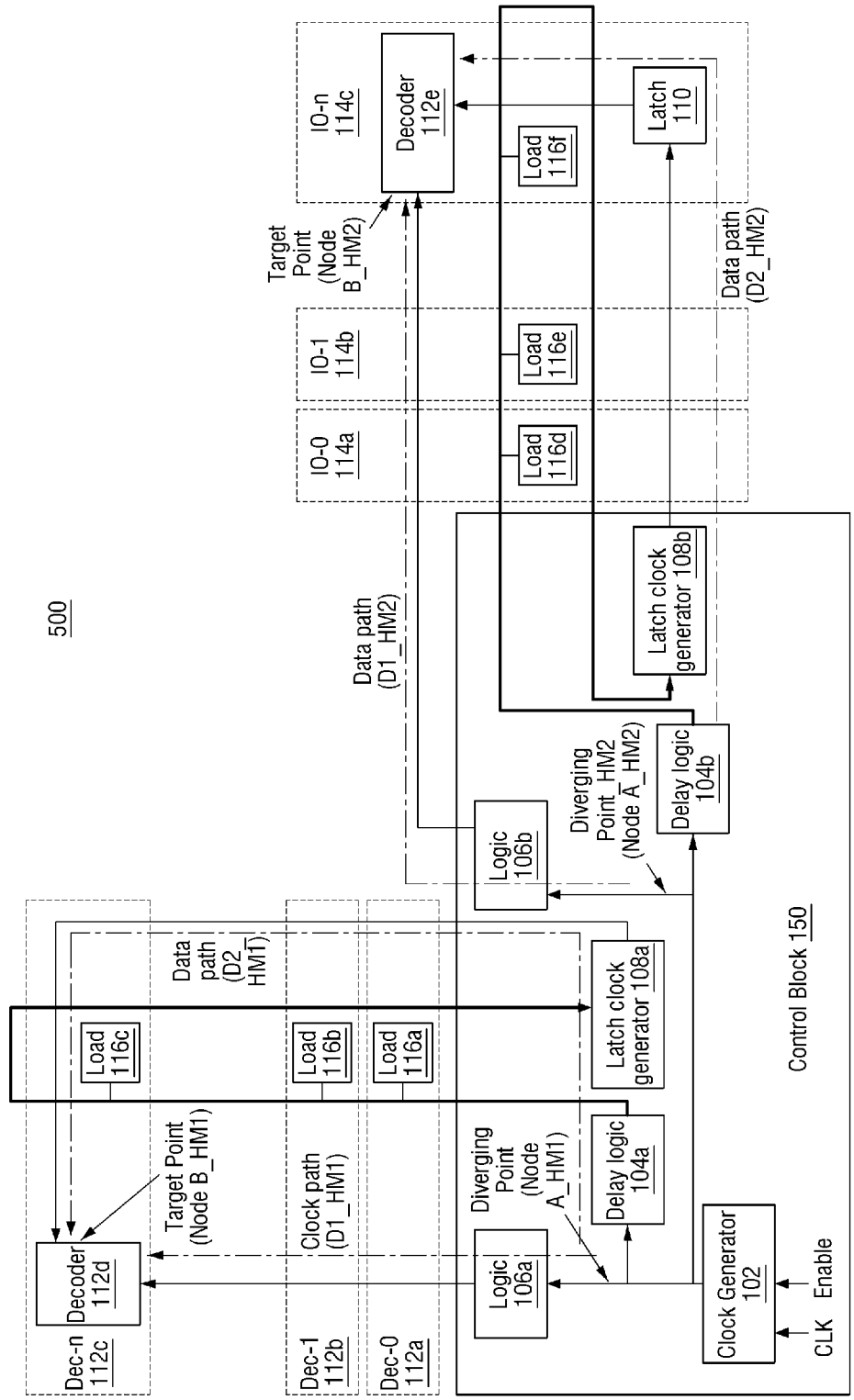
FIG. 5 is a circuit diagram illustrating the RC-network delay across rows and columns for different latch clock generations, according to an embodiment as disclosed herein.

Referring to FIG. 5, the semiconductor memory device including the memory cell array (not shown) having the plurality of memory cells (not shown) arranged in the matrix of rows and columns. The plurality of word lines (not shown) is arranged to correspond to the respective rows of the memory cells. The plurality of bit lines (not shown) is arranged to correspond to the respective columns of the memory cells. The wire contains parasitic resistance (not shown), and the load cell connected to the wire is nothing but capacitance.

The circuit diagram 500 includes the control block 150, the latch 110, the set of decoders 112a-112e, the IO circuits 114a-114c, and the set of loads 116a-116f, where the control block 150 includes the clock generator 102, the delay logics 104a and 104b, the logics 106a and 106b, and the latch clock generators 108a and 108b. The clock input and the enable input are provided to the clock generator 102. The latch clock generator 108b is connected with the latch circuit 110. The latch circuit 110 is connected with the decoder 112e.

In the circuit diagram 500, two hold margins (i.e., HM1 and HM2) exist, where the HM1=D2_HM1−D1_HM1, and the HM2=D2_HM2−D1_HM2. The diverging point for HM1 is NODE A_HM1 and for HM2 is NODE A_HM2. The converging point for HM1 is NODE B_HM1 and for HM2 is Node B_HM2.

In this design, different latch clock generators 108a and 108b are used for the two hold margins.

The delay associated with the clock paths (D1_HM1 and D1_HM2) is induced using a combination of the logic circuits 106a and 106b and the wire routed across the columns and the rows of the semiconductor memory device. The data path (i.e., D2_HM1) is implemented using a combination of the delay logic 104a, the loads 106a-106c and the wire placed across the rows of the semiconductor memory device, whereas the data path (i.e., D2_HM2) is implemented using combination of the delay logic 104b, the loads 116d-116f and the wire spread across columns of the semiconductor memory device.

In an embodiment, the two hold margins (HM1 and HM2) exist: (1) HM1=D2_HM1−D1_HM1 and (2) HM2=D2_HM2−D1_HM2. In this scheme different latch clock generators are used for the two hold margins. Data path D2_HM1 is implemented using a combination of delay logic, wire and loads spread across rows, whereas the data path D2_HM2 is implemented using a combination of delay logic, wire and loads spread across columns.

FIG. 6 is a flow diagram 600 illustrating a method for controlling the hold-margin of the semiconductor memory device, according to an embodiment as disclosed herein. At 602, the method includes inducing the delay associated with the clock path (D1) using a combination of the logic 106 and the wire placed across at least one of the column and the row of the semiconductor memory device. At 604, the method includes inducing the delay associated with the data path (D2) using a combination of the delay cell 104, at least one load and the wire placed across at least one of the column and the row of the semiconductor memory device. At 606, the method includes controlling the hold-margin based on the delay associated with the data path (D2) and the delay associated with the clock path (D1).

The disclosed method can be used to determine the required amount of delay associated with the delay logic 104 in the data path (D2) to control the hold margin when the number of columns are minimum.

The disclosed method can be used to determine the required amount of delay in the data path (D2) to control the hold margin when the number of columns are maximum.

The disclosed method can be used to control the hold-margin of the semiconductor memory device using the programmable RC network based on at least a difference between the required amount of delay associated with the data path (D2) when the number of columns is maximum and the required amount of the delay associated with the data path (D2) when the number of columns is minimum.

The disclosed method can be used to determine the required amount of delay associated with the delay logic 104 in the data path (D2) to control the hold margin when the number of rows is minimum.

In an embodiment, the method can be used to determine a required amount of delay in the data path (D2) to control the hold margin when the number of rows is maximum.

In an embodiment, the method can be used to control the hold-margin of the semiconductor memory device using the programmable RC network based on a difference between the required amount of delay associated with the data path (D2) when the number of rows is maximum and the required amount of delay associated with the data path (D2) when the number of rows is minimum.

The various actions, acts, blocks, steps, or the like in the method 600 may be performed in the order presented, in a different order or simultaneously. Further, in some embodiments, some of the actions, acts, blocks, steps, or the like may be omitted, added, modified, skipped, or the like without departing from the scope of the disclosure.

The embodiments disclosed herein can be implemented through at least one software program running on at least one hardware device and performing network management functions to control the elements. The elements shown in the FIGS. 2 to 6 include blocks, elements, actions, acts, steps, or the like which can be at least one of a hardware device, or a combination of hardware device and software module.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The foregoing description of the specific embodiments will so fully reveal the general nature of the embodiments herein that others can, by applying current knowledge, readily modify and or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments as described herein.

We claim:

1. A method for controlling hold-margin of a semiconductor memory device, the method comprising:
    inducing a delay associated with a clock path using a combination of a logic circuit and a wire placed across at least one of a column and a row of the semiconductor memory device;
    inducing a delay associated with a data path using a combination of a delay logic circuit and at least one of a load cell and a wire placed across at least one of a column and a row of the semiconductor memory device; and
    controlling the hold-margin based on the delay associated with the data path and the delay associated with the clock path, wherein the hold-margin is a parasitic delay based hold-margin.

2. The method of claim 1, wherein the delay associated with the data path is based on operation of the delay logic circuit along with a programmable resistor-capacitor (RC) network.

3. The method of claim 1, wherein the hold-margin corresponds to a difference between the delay associated with the data path and the delay associated with the clock path.

4. The method of claim 1, wherein the method further comprises managing the hold-margin across a process, voltage and temperature (PVT) corner.

5. The method of claim 1, wherein a required amount of the delay associated with the delay logic circuit in the data path to control the hold-margin is determined for a minimum number of columns.

6. The method of claim 5, wherein:
a required amount of the delay associated with the data path to control the hold-margin is determined for a maximum number of columns, and
a difference between the required amount of the delay associated with the data path for the maximum number of columns and the required amount of the delay associated with the data path for the minimum number of columns is used to control the hold-margin of the semiconductor memory device using the programmable RC network.

7. A system for controlling a hold-margin in a semiconductor memory device, the system comprising:
a delay logic circuit;
a latch clock generator;
a clock generator, wherein the clock generator generates a clock signal and a data path; and
a programmable resistor-capacitor (RC) network, wherein the programmable RC network is communicatively coupled to the delay logic circuit, the latch clock generator and a latch circuit, wherein:
a delay associated with a clock path is induced using a combination of a logic circuit and a wire placed across at least one of a column and a row of the semiconductor memory device,
a delay associated with the data path is induced using a combination of the delay logic circuit and at least one of a load cell and a wire placed across at least one of a column and a row of the semiconductor memory device, and
the system controls the hold-margin based on the delay associated with the data path and the delay associated with the clock path.

8. The system of claim 7, wherein the hold-margin corresponds to a difference between the delay associated with the data path and the delay associated with the clock path.

9. The system of claim 7, wherein the hold-margin is a parasitic delay based hold-margin.

10. The system of claim 7, wherein the delay associated with the data path is based on operation of the delay logic circuit along with the programmable RC network.

11. The system of claim 7, wherein the system manages the hold-margin across a process, voltage and temperature (PVT) corner.

12. The system of claim 7, wherein the system determines a required amount of the delay associated with the delay logic circuit in the data path to control the hold-margin for the minimum number of columns.

13. The system of claim 12, wherein:
the system determines a required amount of the delay in the data path to control the hold-margin for the maximum number of columns, and
a difference between the required amount of the delay associated with the data path for the maximum number of columns and the required amount of the delay associated with the data path for the minimum number of columns is used to control the hold-margin of the semiconductor memory device using the programmable RC network.

* * * * *